(12) United States Patent
Vaufredaz et al.

(10) Patent No.: US 8,298,916 B2
(45) Date of Patent: Oct. 30, 2012

(54) PROCESS FOR FABRICATING A MULTILAYER STRUCTURE WITH POST-GRINDING TRIMMING

(75) Inventors: Alexandre Vaufredaz, La Murette (FR); Sebastien Molinari, Sassenage (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/043,088

(22) Filed: Mar. 8, 2011
(Under 37 CFR 1.47)

(65) Prior Publication Data
US 2011/0230003 A1 Sep. 22, 2011

(51) Int. Cl.
*H01L 21/46* (2006.01)

(52) U.S. Cl. ........ 438/459; 438/455; 438/456; 438/457; 438/458; 257/E21.088; 257/E21.122; 257/E21.237; 257/E21.238; 257/E21.567

(58) Field of Classification Search .................. 438/455, 438/456, 457
See application file for complete search history.

(56) References Cited

U.S. PATENT DOCUMENTS

| | | | |
|---|---|---|---|
| 5,834,812 A | 11/1998 | Golland et al. | |
| 5,937,312 A | 8/1999 | Iyer et al. | |
| 6,387,815 B2 | 5/2002 | Sakamoto | |
| 6,841,848 B2 | 1/2005 | MacNamara et al. | |
| 7,531,425 B2 * | 5/2009 | Nakano et al. | 438/455 |
| 7,713,842 B2 | 5/2010 | Nishihata et al. | |
| 7,718,507 B2 | 5/2010 | Morita et al. | |
| 2002/0187595 A1 | 12/2002 | Walitzki et al. | |
| 2003/0092244 A1 * | 5/2003 | Oi et al. | 438/455 |
| 2006/0055003 A1 | 3/2006 | Tomita et al. | |
| 2009/0111245 A1 | 4/2009 | Okabe et al. | |
| 2009/0203167 A1 | 8/2009 | Mitani | |
| 2011/0230005 A1 * | 9/2011 | Vaufredaz et al. | 438/73 |
| 2012/0028439 A1 * | 2/2012 | Zhang et al. | 438/459 |

FOREIGN PATENT DOCUMENTS

| | | |
|---|---|---|
| EP | 0444942 A1 | 9/1991 |
| EP | 0451993 A2 | 10/1991 |
| EP | 0854500 A1 | 7/1998 |
| EP | 0860862 A2 | 8/1998 |
| EP | 0935280 A1 | 8/1999 |

(Continued)

OTHER PUBLICATIONS

French Search Report for French Application No. FR1051485 dated Sep. 29, 2010, 5 pages.

*Primary Examiner* — Charles Garber
*Assistant Examiner* — Yasser Abdelaziez
(74) *Attorney, Agent, or Firm* — TraskBritt

(57) ABSTRACT

The invention relates to a process for fabricating a multilayer structure comprising: bonding a first wafer onto a second wafer, at least the first wafer having a chamfered edge; and thinning the first wafer so as to form in a transferred layer, the thinning comprising a grinding step and a chemical etching step. After the grinding step and before the chemical etching step, a trimming step of the edge of the first wafer is carried out using a grinding wheel, the working surface of which comprises grit particles having an average size of less than or equal to 800-mesh or greater than or equal to 18 microns, the trimming step being carried out to a defined depth in the first wafer so as to leave a thickness of the first wafer of less than or equal to 35 μm in the trimmed region.

22 Claims, 4 Drawing Sheets

FOREIGN PATENT DOCUMENTS

| | | |
|---|---|---|
| EP | 0964436 A2 | 12/1999 |
| EP | 1170801 A1 | 1/2002 |
| EP | 1189266 A1 | 3/2002 |
| EP | 1507292 A1 | 2/2005 |
| EP | 1855309 A1 | 11/2007 |
| EP | 1887613 A1 | 2/2008 |
| EP | 2023375 A1 | 2/2009 |
| FR | 2935535 | 3/2010 |
| JP | 03089519 | 4/1991 |
| JP | 04263425 | 9/1992 |
| JP | 07045485 | 2/1995 |
| JP | 09017984 | 1/1997 |
| JP | 11017701 | 1/1999 |
| JP | 11354761 | 12/1999 |
| JP | 2001144274 | 5/2001 |
| WO | 2010026006 A1 | 3/2010 |

\* cited by examiner

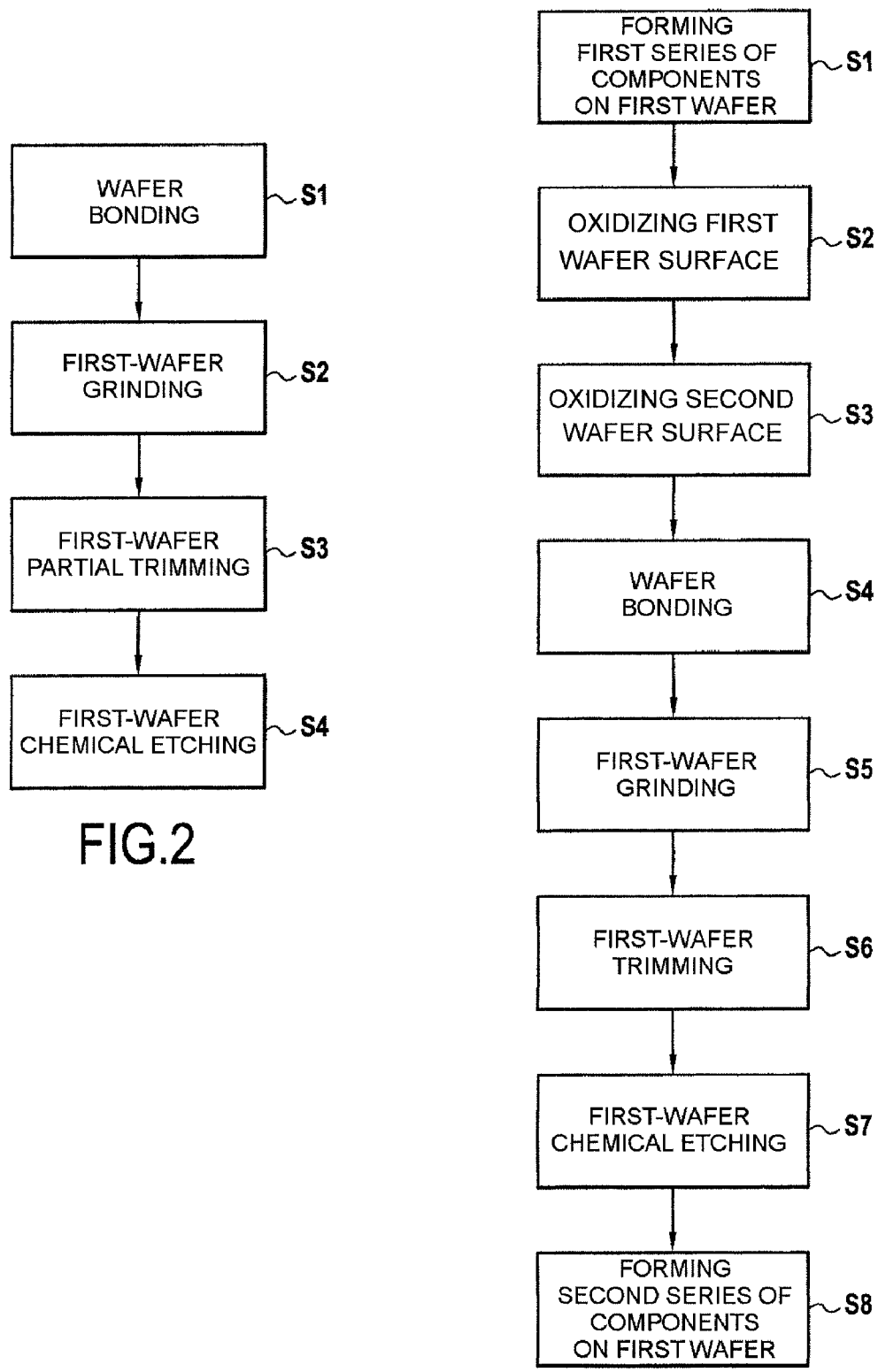

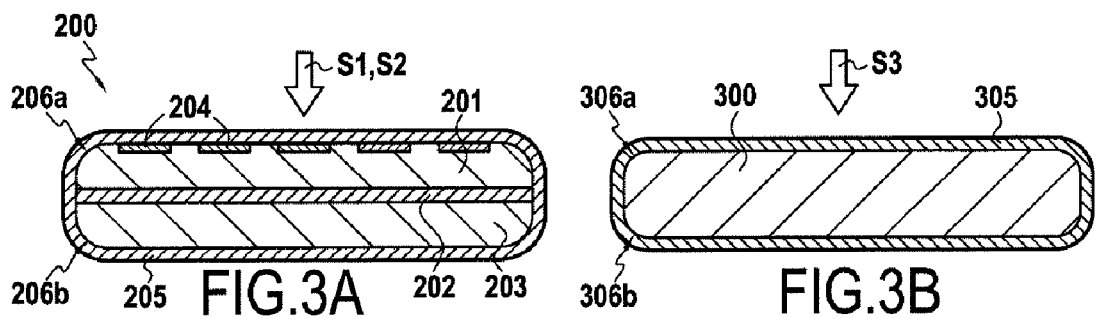
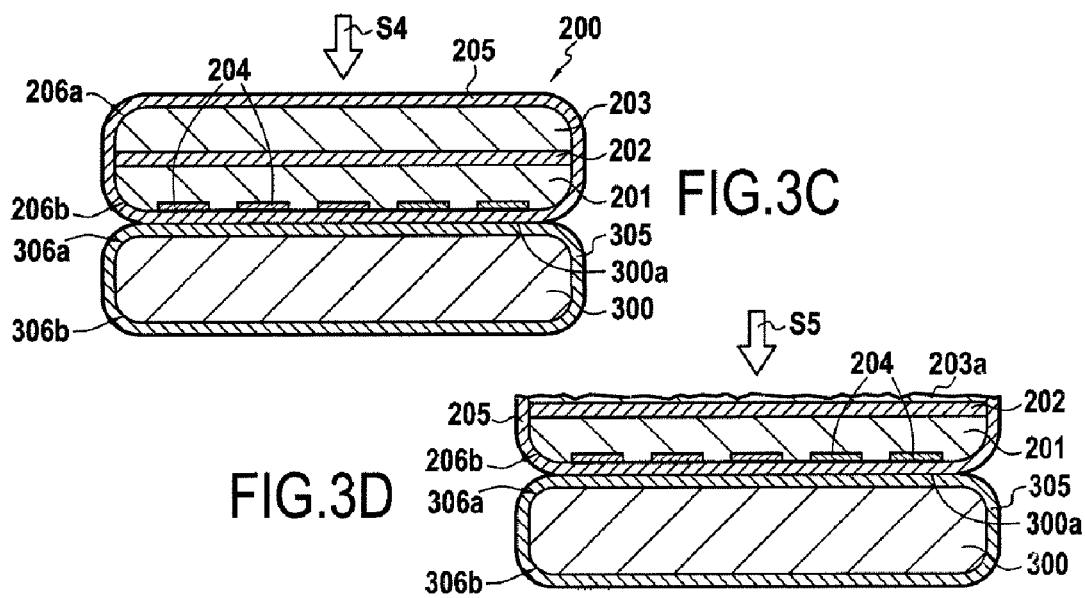
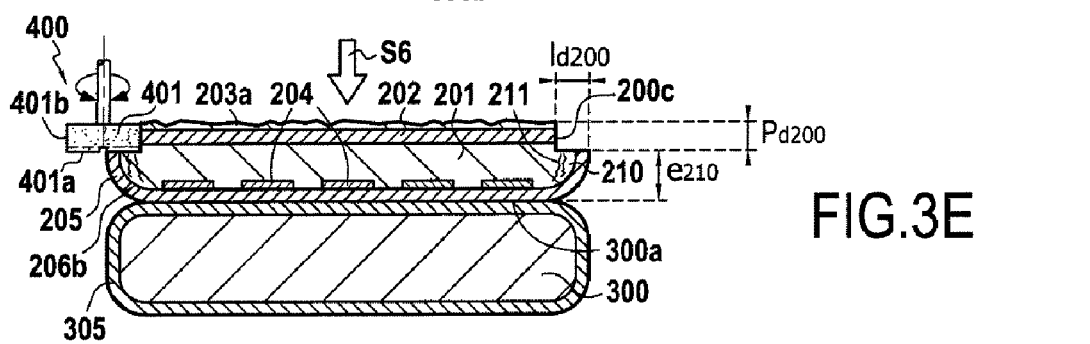
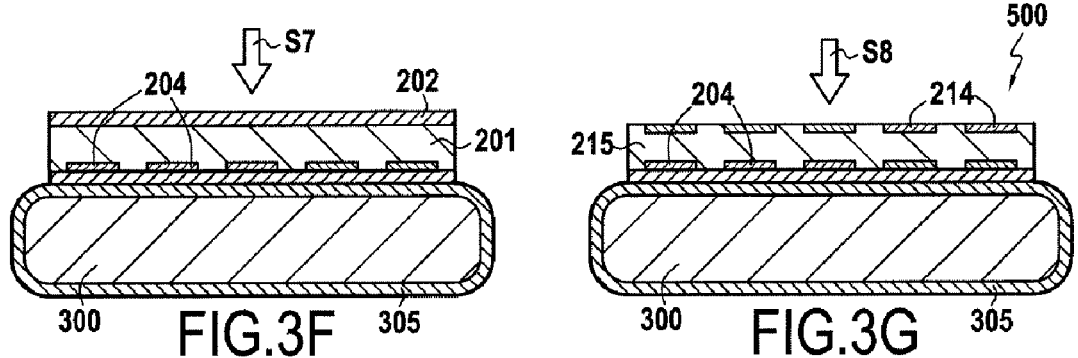

PROCESS FOR FABRICATING A MULTILAYER STRUCTURE WITH POST-GRINDING TRIMMING

TECHNICAL FIELD

The present invention relates to the field of fabricating multilayer semiconductor structures or substrates (also called multilayer semiconductor wafers) fabricated by transferring at least one layer onto a support.

BACKGROUND

Fabrication of multilayer structures comprises, in general, direct wafer bonding of a first wafer, for example, a silicon or SOI (silicon-on-insulator) wafer, onto a second wafer or support, for example, made of silicon or sapphire, a bond-strengthening anneal and thinning of the first wafer so as to form a layer transferred onto the second wafer.

The invention, more particularly, concerns multilayer structures having a relatively weak bonding interface due to the limitation in the temperature of the bond-strengthening anneal. After direct wafer bonding, the structure is normally annealed so as to strengthen the bond between the two wafers, that is to say, to increase the surface energy of the bond between them. The higher the temperature of the bond-strengthening anneal, the greater the resulting bond or adhesion energy.

Now, there are several cases of multilayer structures in which the bond annealing temperature must be limited to relatively low values.

A first case concerns the fabrication of what are called "heterogeneous" multilayer structures, heterogeneous in that the two wafers to be assembled have different coefficients of thermal expansion, for example, different by at least 10% or 20% at room temperature (20° C.). Such heterostructures are especially SOS (silicon-on-sapphire ($Al_2O_3$)) structures used particularly in microelectronics or in optoelectronics. During increases in temperature, for example, from 200° C. and above, the variations in behavior of one of the two wafers relative to the other cause stresses and/or strains in the heterostructure that can lead to delamination or detachment of the wafers, or layers if present, and/or plastic deformations and/or cracks and/or breakage of one of the substrates, or layers if present. This is why, with such structures, the temperature of the bond-strengthening anneal is limited.

A second case concerns multilayer structures in which the first wafer furthermore comprises all or part of a component or of a plurality of microcomponents, as is the case in 3D-integration technology that requires one or more layers of microcomponents to be transferred onto a final support, but also in the case of circuit transfer, as, for example, in the fabrication of backlit imagers. In this case, the temperature of the bond-strengthening anneal must be limited so as not to damage the microcomponents.

The edges of the wafers used especially to form the transferred layers and the supports generally are chamfered or have rounded edges, the role of which is to make handling easier and to prevent edge flaking that could occur if these edges were sharp, such flakes being sources of particulate contamination of the surfaces of wafers. The chamfers may have a rounded and/or bevelled form.

However, the presence of these chamfers prevents a good contact between the wafers at their periphery, this adhesion weakness being even more pronounced when the bonding interface is weak due to the limitation in the temperature of the bond-strengthening anneal as described hereinabove. Consequently, there is a peripheral region in which the first wafer or transferred layer is weakly bonded, or not at all bonded. This peripheral region of the first wafer or transferred layer must be removed because it is liable to break in an uncontrolled way and to contaminate the structure with undesirable fragments or particles.

Hence, once the wafer is bonded onto the support, and after the wafer has been thinned, the transferred layer is trimmed so as to remove the peripheral region over which the chamfers extend. The trimming is normally carried out by mechanically machining, especially by abrasion, the exposed surface of the transferred layer as far as the supporting second wafer.

However, a deep mechanical trimming causes peel-off problems both at the bonding interface between the transferred layer and the support, and in the transferred layer itself. More precisely, at the bonding interface the peel-off problems correspond to delamination of the transferred layer in certain regions near the periphery of the layer, which may be termed "macro peel-off." The bond energy is weaker near the periphery of the layer due to the presence of the chamfers. Consequently, this trimming may lead, in this location, to a partial debonding of the layer at its bonding interface with the supporting substrate.

Consequently, the problem arises of finding a process that allows the first wafer, or transferred layer, in a multilayer structure to be trimmed without the above-mentioned drawbacks.

DISCLOSURE

The object of the invention is to alleviate the aforementioned drawbacks by providing a process for fabricating a multilayer structure comprising:
  bonding a first wafer onto a second wafer, at least the first wafer having a chamfered edge; and
  thinning the first wafer so as to form a transferred layer, the thinning comprising a grinding step and a chemical etching step,
in which process, after the grinding step and before the chemical etching step, a step of trimming the edge of the first wafer is carried out using a grinding wheel, the working surface of which comprises grit particles having an average size of less than or equal to 800-mesh or greater than or equal to 18 microns, the trimming step being carried out to a defined depth in the first wafer so as to leave in the trimmed region a thickness of the first wafer of less than or equal to 35 µm.

Thus, by carrying out, before the step of chemically etching, a partial mechanical trimming (i.e., one that does not extend as far as the bonding interface) of the first wafer under the conditions defined hereinabove, the aforementioned peel-off problems are avoided, whilst the remaining portion to be trimmed is sufficiently weakened that it can then be easily removed during the chemical etching step.

According to one aspect of the invention, the trimming step is carried out over a width at least equal to the width over which the chamfered edge extends.

According to another aspect of the invention, when the first wafer is a silicon wafer or an SOI structure, the flank of the first layer may be especially machined to an angle of about 45° to the plane of the wafer, thereby preventing the flank from being etched during the subsequent chemical etching step.

According to one particular embodiment of the invention, the process comprises, before the bonding step, at least one step of fabricating a layer of components on one side of the first wafer, the side of the first wafer comprising the layer of components being bonded onto the second wafer. A step of fabricating a second layer of microcomponents on the side of the first wafer opposite the side comprising the first layer of components may furthermore be carried out.

The use of the trimming process of the invention allows three-dimensional structures to be fabricated by stacking two or more wafers, whilst minimizing the risks of delamination both at the bonding interfaces between the wafers and in the layers of components. One of the layers of components may especially comprise image sensors.

BRIEF DESCRIPTION OF THE DRAWINGS

Other features and advantages of the invention will become clear from the following description of particular embodiments of the invention, given by way of non-limiting example, with reference to the appended drawings, in which:

FIG. 2 is a flowchart of the steps implemented during the process illustrated in FIGS. 1A to 1E;

FIGS. 3A to 3G are schematic views showing the fabrication of a three-dimensional structure conforming to an embodiment of the invention; and FIG. 4 is a flowchart of the steps implemented during the fabrication of the three-dimensional structure illustrated in FIGS. 3A to 3G.

DETAILED DESCRIPTION OF THE INVENTION

Figure 1A:
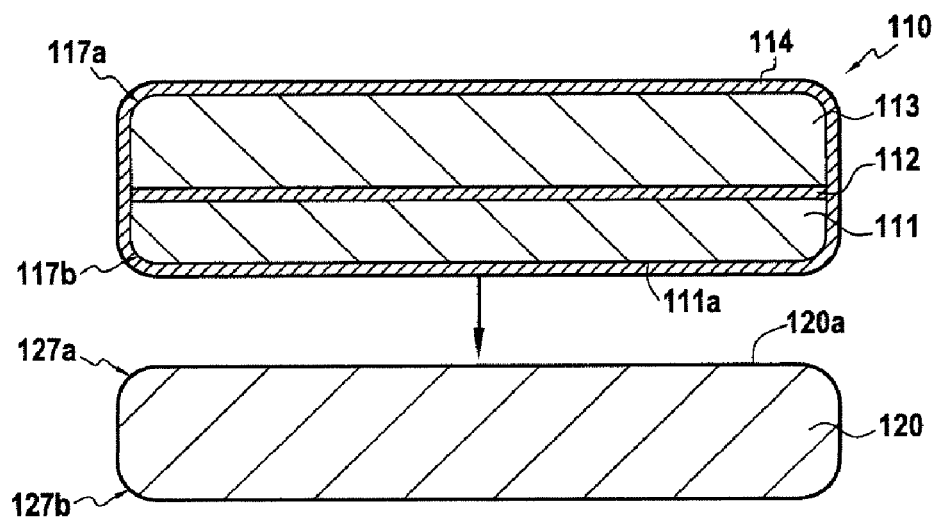
FIGS. 1A to 1E are schematic views of a process for fabricating a multilayer structure conforming to a embodiment of the invention.

The present invention is applicable, generally, to the trimming of a multilayer structure comprising at least two wafers joined to each other by bonding and for which the surface energy of the bond, that is to say, the "bond energy, " is in particular limited to 1 J/m² or less, and at least one of the two wafers having chamfers or rounded edges on its periphery. Such multilayer structures correspond especially to structures fabricated from at least two wafers having different coefficients of thermal expansion, or comprising microcomponents, and for which the temperature of the bond-strengthening anneal, allowing the bond energy to be increased, must be limited. The invention could be equally applied to multilayer structures in which the wafers are joined to each other by another type of bonding such as anodic bonding, metallic bonding, or adhesive bonding—provided the bond energy remains limited.

The wafers are generally circular and may have various diameters, especially diameters of 100 mm, 150 mm, 200 mm or 300 mm.

Components may have already been formed in one of the wafers, which is then bonded onto the other wafer that acts as a support. The term "components" is understood here to mean any element fabricated with materials different from that of the wafer and which are sensitive to the high temperatures customarily used to strengthen the bonding interface. These components correspond especially to elements forming all, or part, of an electronic component or of a plurality of electronic microcomponents, such as circuits or contacts or even active layers.

The invention is more particularly, but not exclusively, applicable to SOS heterostructures formed by assembling a first sapphire wafer or substrate and a second wafer or substrate comprising silicon such as an SOI structure. Heterostructures comprising a silicon layer on a sapphire substrate have particular advantages. SOS structures allow high-frequency, low-power-consumption devices to be fabricated.

The use of sapphire substrates furthermore allows very good heat dissipation, better than that obtained, for example, using quartz substrates.

The present invention proposes to carry out only a partial trimming of the transferred layer, i.e., a trimming in which the transferred layer is trimmed to a depth of less than the total thickness of the transferred layer, the remaining thickness of the transferred layer in the trimmed region being less than 35 microns and, preferably, greater than or equal to 10 microns. The transferred layer corresponds to one of the two wafers of the structure, which was thinned after bonding. Thinning comprises a grinding first step in which most of the material is removed, and a chemical etching second step, corresponding to a step of finishing the thinning, in particular for smoothing the work-hardened surface of the transferred layer that results from the grinding. According to the present invention, the partial trimming is carried out between the grinding step and the chemical etching step of the thinning, the trimming being carried out with what is called a "coarse" grinding wheel, i.e., a grinding wheel the working surface or active part of which comprises grit particles with an average size of greater than or equal to 18 microns (or less than or equal to 800-mesh). The grit particles may be especially diamond particles. By way of example, the reference of a grinding wheel model sold by Saint-Gobain comprising diamond grit particles of a 44-micron (or 325-mesh) average size is: COARSE WHEEL STD -223599: 18BB-11-32B69S11,034× 1⅛×9,001 MD15219669014111620 COARSE #3R7B69-⅛.

The partial trimming thus carried out allows the ring or portion of transferred layer remaining after the partial trimming to be mechanically weakened, especially by creating microcracks in the latter. This ring, corresponding to the remainder of the transferred layer to be trimmed, is then preferentially etched during the finishing of the chemical etching step of the thinning due to its mechanical weakness, for example, by infiltration of the etching solution or reactive species into the microcracks created during the partial trimming.

One implementation of a trimming process will now be described in relation to FIGS. 1A to 1E and FIG. 2.

Described with reference to FIGS. 1A to 1E and FIG. 2 is a process for fabricating an SOS heterostructure from a first wafer or initial substrate 110 (top) and a second wafer or support substrate 120 (bottom). The first wafer 110 comprises, at its periphery, a top chamfer 117a and a bottom chamfer 117b. Likewise, the second wafer 120 comprises, at its periphery, a top chamfer 127a and a bottom chamfer 127b. The first wafer 110 has a thickness of between about 600 μm and 900 μm.

As shown in FIG. 1A, the first wafer 110 consists of an SOI structure comprising a silicon layer 111 on a support 113 also made of silicon, a buried oxide layer 112, for example, made of $SiO_2$, being placed between the layer 111 and the support 113. The exterior surface of the first wafer 110 has furthermore been previously covered with a thermal-oxide layer 114, formed, for example, by oxidation of the surface of the wafer, so as to protect the latter during the subsequent chemical etching step. The first wafer 110 may also consist of a monolithic silicon wafer which may or not comprise components.

The second wafer 120 consists of a sapphire wafer (FIG. 1A).

Figure 1B:
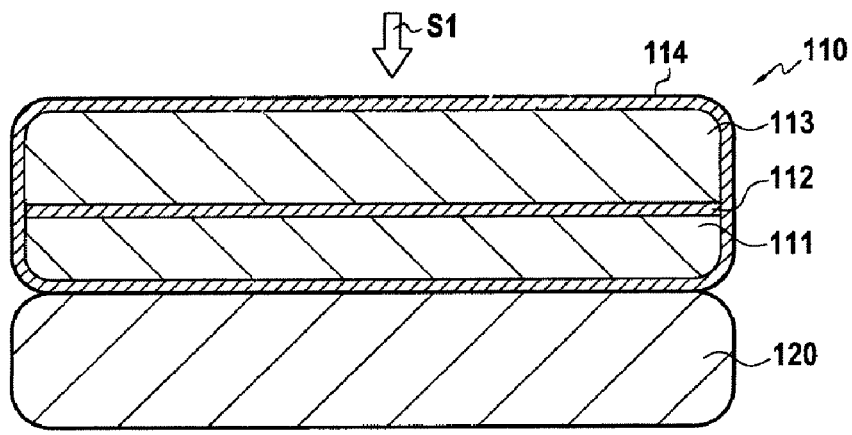

The bottom side 111a (here covered with the oxide layer 114) of the first wafer 110 and the top side 120a of the second wafer 120 are placed in intimate contact and pressure is applied to one of the two wafers so as to initiate the propagation of a bonding wave between the surfaces in contact (step S1, FIG. 1B).

As is well known per se, the principle of direct wafer bonding, or just direct bonding, is based on direct contact between two surfaces—that is to say, that no specific material (adhesive, wax, braze, etc.) is used. To carry out such an operation, it is necessary for the bonding surfaces to be sufficiently smooth, particle- and contamination-free, and for the bonding surfaces to be placed sufficiently close to each other so that a contact is initiated—typically a distance of less than a few nanometers is required. In this case, the attractive forces between the two surfaces are strong enough that direct bonding occurs, i.e., bonding induced by the Van der Waals forces between the atoms or molecules of the two surfaces to be bonded.

The bonding thus carried out is not stable until a bond-strengthening anneal has been carried out. It is possible to subject the assembly of the two wafers to an anneal, but the temperature of this anneal must necessarily be limited because of the difference in the coefficient of thermal expansion between the two wafers. In the example described here, the anneal cannot exceed 180° C. for a time of less than about ten hours. Such an anneal only allows stabilization of the bond to the extent that the surface energy of the bond does not exceed 700 mJ/m$^2$.

The fabrication of the heterostructure continues with thinning of the first wafer 110 so as to form a transferred layer corresponding to a portion of the first wafer 110. Thinning is carried out first by grinding away most of the support 113 of the first wafer 110 (step S2, FIG. 1C). The grinding is carried out by keeping the working surface of a grinding wheel against the exposed side of the first wafer 110 (not shown in FIG. 1C). During the grinding, the two-wafer assembly is held on the back side of the second wafer 120 by a holder (not shown in FIG. 1C), also called a chuck, comprising a platen able to hold the second wafer 120, for example, by suction or by an electrostatic system. During the grinding, the chuck may be stationary whilst the grinding wheel is rotated. Alternatively, the chuck may also rotate about an axis, the grinding wheel may or not be rotated.

The grinding is stopped about 65 μm from the surface 120a of the sapphire support substrate.

Figure 1C:
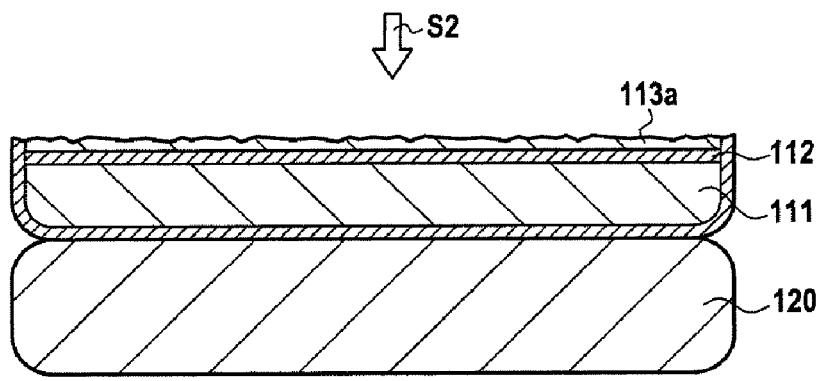

At this stage in the thinning, i.e., before the second thinning step is carried out chemically, the remaining part 113a of the support 113 of the first wafer 110 has a work-hardened surface (FIG. 1C).

Figure 1D:
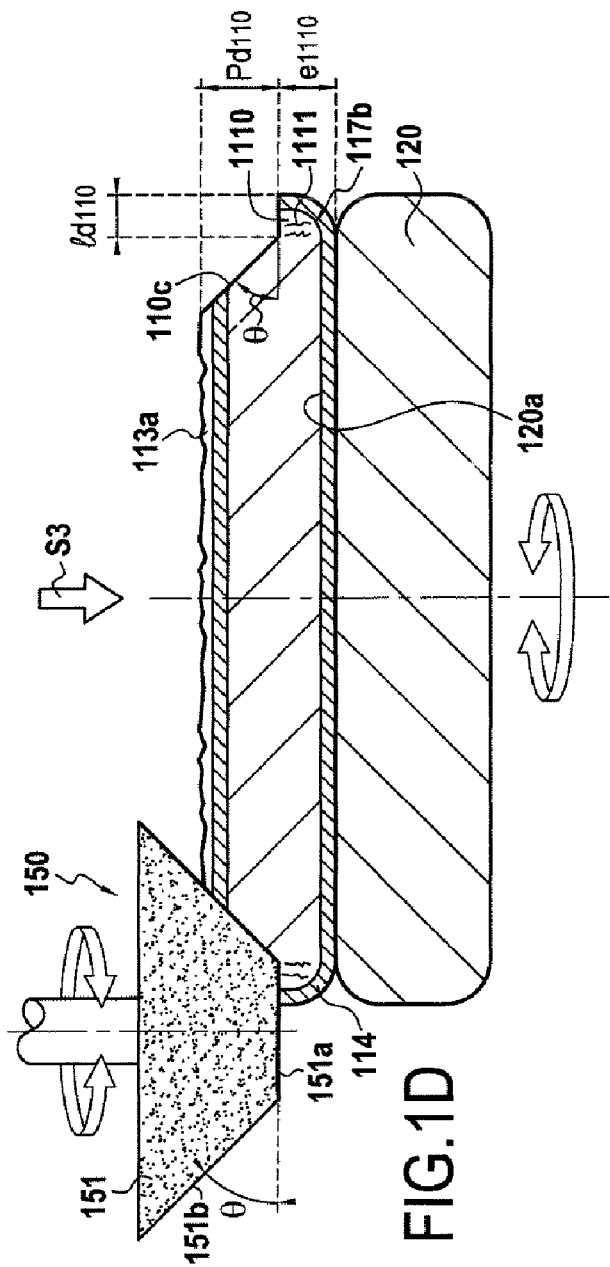
Figure 1E:
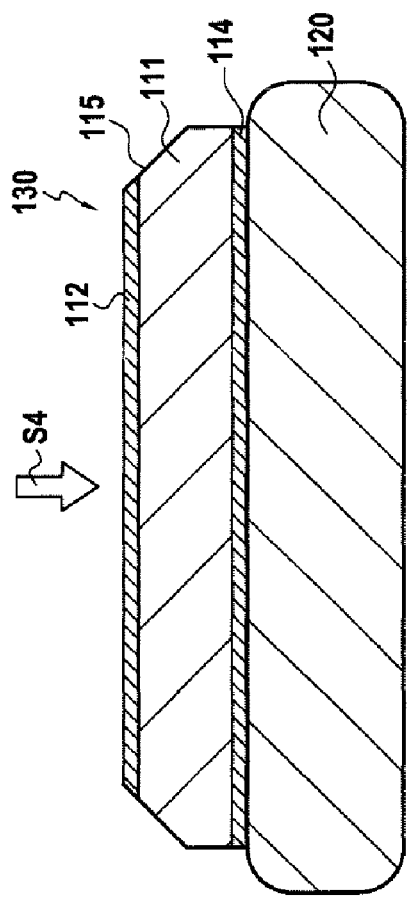

In accordance with the invention, before the second thinning step, namely the chemical etching, the first wafer 110 is partially trimmed, that is to say an annular portion of the first wafer 110 located on the periphery or edge of the latter, extending over some of the thickness of the first wafer 110, is removed (step S3, FIG. 1D).

As illustrated in FIG. 1D, a minimum width $ld_{110}$ from the edge of the first wafer 110 is trimmed. For wafers with a diameter of 100 mm, 200 mm and 300 mm, the width $ld_{110}$ trimmed is, in general, between 2 mm and 10 mm, preferably between 2 mm and 6 mm.

Trimming is carried out by mechanical action or machining (edge grinding) from the top side of the first wafer 110. The mechanical action may be applied by a grinding wheel (abrasion) or any other tool capable of mechanically wearing away the material of the layer.

In the example described here, trimming is carried out by means of a grinding wheel 150 that has a working surface or active part 151, that is to say, the surface that comprises grit particles able to grind away the material of the wafer, is formed by a first portion 151a parallel to the plane of the wafer and a second portion 151b corresponding to the flank of the grinding wheel 150. As shown in FIG. 1D, the portion 151b that makes an angle θ of about 45° to the portion 151a, so as to trim a flank 110c in the first wafer 110 also makes an angle θ of about 45° to the plane of the first wafer 110. In accordance with the invention, the working surface 151 of the grinding wheel 150 comprises grit particles, such as diamond particles, with an average size of greater than or equal to 18 microns (or less than or equal to 800-mesh).

During trimming, the first wafer 110 is ground to a depth $Pd_{110}$ defined from a reference plane corresponding to the bonding interface (here the plane of contact between the thermal-oxide layer 114 and the bonded side 120a of the second wafer 120). The depth $Pd_{110}$ is chosen so as to remove, at the edge of the first wafer 110, only some of the thickness of the latter (partial trimming). In the example described here, the trimming depth $Pd_{110}$ is chosen so as to leave, at the edge of the first wafer 110, an annular portion or ring 1110 of a reduced thickness $e_{1110}$. In accordance with the invention, the thickness $e_{1110}$ of the annular portion 1110 formed after partial trimming is less than or equal to 35 μm, beyond which thickness the trimming carried out with a coarse grinding wheel, as defined hereinabove, causes the annular portion 1110 to be mechanically weakened, especially by creating cracks 1111 in the latter (FIG. 1D). In certain cases, trimming carried out in this way may lead to local lift-off of the annular portion 1110.

Thinning of the first wafer 110 continues with chemical etching, also called wet etching, of the remaining portion 113a (step S4, FIG. 1E), for example, by means of a TMAH (tetramethylammonium hydroxide) or KOH (potassium hydroxide) etching solution, or even by dry etching such as RIE (reactive ion etching).

In addition to removing the remaining portion 113a, the chemical etching has the effect of removing the remaining annular portion 1110. This chemical removal of the residual annular portion 1110 is made easier by the mechanical weakening of this annular portion 1110 during trimming and, especially, by the creation of cracks, which the etching solution, or reactive species (in the case of RIE), infiltrates. The remainder of the first wafer 110 is not, or is hardly, etched by the etching due, on the one hand, to the presence of the thermal-oxide layer 114 and the oxide layer 112, which is used here as a stop layer. On the other hand, as in the example described here, the first wafer 110 may be trimmed so that the flank 110c of the trimmed portion makes an angle of 45° to the plane of the first wafer 110—the efficiency of the etch is dependent on the crystal plane presented at the exposed surfaces (the etching solution barely etches a (110) crystal plane compared to a (100) crystal plane).

After etching, an SOS multilayer structure 130 is thus obtained, comprising a sapphire support formed by the second wafer 120 and a transferred layer 115 corresponding at least to the silicon layer 111 of the first wafer 110—the oxide layer 112 may be, as required, preserved or removed, for example, by HF deoxidation.

A process for fabricating a three-dimensional structure by transfer of a layer of microcomponents formed in a first wafer or an initial substrate 200 onto a second wafer or support (bottom) substrate 300 according to one embodiment of the invention will now be described in relation to FIGS. 3A to 3G and FIG. 4.

The fabrication of the three-dimensional structure starts with the formation of a first series of microcomponents 204 on the surface of the first wafer 200, the peripheral edge of which has a top chamfer 206a and a bottom chamber 206b (FIG. 3A, step S1). In the example described here, the first wafer 200 is an SOI multilayer structure, that is to say it comprises a silicon layer 201 placed on a substrate 203 also made of silicon, a buried oxide layer 202 (for example, a layer of $SiO_2$) being present between the silicon layer 201 and the substrate 203. The first wafer 200 has a thickness of between about 600 and 900 μm.

The microcomponents 204 are formed by photolithography, by means of a mask for defining the regions where the patterns corresponding to the microcomponents 204 to be fabricated will be formed.

As shown in FIG. 3A, the external surface of the first wafer 200 is then covered with a thermal-oxide layer 205, formed, for example, by oxidation of the surface of the first wafer 200, so as to protect the latter during the subsequent chemical etching step (step S2). The first wafer 200 may also be made of a monolithic silicon wafer.

The second wafer or support substrate 300 is a silicon wafer, the peripheral edge of which has a top chamfer 306a and a bottom chamfer 306b. The external surface of the wafer 300 is covered with a thermal-oxide layer 305 (FIG. 3B, step S3).

That side of the first wafer 200 comprising the microcomponents 204 is then placed in intimate contact with a side of the second wafer 300 via the thermal-oxide layers 205 and 305, and pressure is applied to one of the two wafers so as to initiate the propagation of a bonding wave between the surfaces in contact (step S4, FIG. 3C).

Adhesion between the two wafers 200, 300 is carried out at not too high of a temperature so as not to damage the microcomponents 204 and/or the first wafer 200. More precisely, after bringing the wafers 200, 300 into contact at room temperature, a bond-strengthening anneal may be carried out, but at a temperature below 450° C., above which temperature certain metals such as aluminium or copper start to melt. Such an anneal only allows stabilization of the bond to the extent that the surface energy of the bond does not exceed 1 $J/m^2$.

After bonding, and as shown in FIG. 3D, the first step of thinning the first wafer 200 is carried out, i.e., part of the latter present above the layer of microcomponents 204, here most of the substrate 203a, is ground away (step S5). The grinding is carried out under the same conditions as described above.

The grinding is stopped about 65 μm from the surface 300a of the second wafer 300.

At this stage of the thinning, that is to say, before the second thinning step is carried out chemically, the remaining part 203a of the support 203 of the first wafer 200 has a work-hardened surface (FIG. 3D).

In accordance with the invention, before the second thinning step, namely the chemical etching, the first wafer 200 is partially trimmed, i.e., an annular portion of the first wafer 200, located on the periphery or edge of the latter and extending over some of the thickness of the first wafer 200, is removed (step S6, FIG. 3E).

In the example described here, trimming is carried out by means of a grinding wheel 400 that has a working surface or active part 401, that is to say, the surface that comprises grit particles able to grind away the material of the wafer, formed by a first portion 401a parallel to the plane of the wafer and a second portion 401b corresponding to the flank of the grinding wheel 400. As shown in FIG. 3E, the portion 401b here is perpendicular to the portion 401a so as to form a flank 200c, trimmed in the first wafer, which is substantially perpendicular to the plane of the first wafer. In accordance with the invention, the working surface 401 of the grinding wheel 400 comprises grit particles, such as diamond particles, with an average size of greater than or equal to 18 microns (or less than or equal to 800-mesh).

As illustrated in FIG. 3E, trimming is carried out over a minimum width $ld_{200}$ from the edge of the first wafer 110. For wafers of 100 mm, 200 mm and 300 mm diameter, the width $ld_{200}$ of the trim is in general between 2 mm and 10 mm, preferably, between 2 mm and 6 mm. In contrast to the example described above in relation to FIGS. 1A to 1E, the trimmed flank 200c of the first silicon wafer 200 does not make a 45° angle to the plane of the wafer but substantially a 90° angle.

During trimming the first wafer 200 is trimmed to a depth $Pd_{200}$, defined from a reference plane corresponding to the bonding interface (here the plane of contact between the thermal-oxide layers 205 and 305). The depth $Pd_{200}$ is chosen so as to remove, at the edge of the first wafer 200, only some of the thickness of the latter (partial trimming). In the example described, the trim depth $Pd_{200}$ is chosen so as to leave, at the edge of the first wafer 200, an annular portion or ring 210 of reduced thickness $e_{210}$. In accordance with the invention, the thickness $e_{210}$ of the annular portion 2010 formed after partial trimming is less than or equal to 35 μm, beyond which thickness the trimming carried out with a coarse grinding wheel, as defined hereinabove, causes the annular portion 210 to be mechanically weakened, especially by creating cracks 211 in the latter (FIG. 3E). In certain cases, trimming carried out in this way may lead to local lift-off of the annular portion 210.

Once the partial trimming has been carried out, thinning of the first wafer 200 continues by chemical etching of the remaining portion 203a (step S7, FIG. 3F), for example, by means of a TMAH or KOH etching solution, or an RIE dry etch.

In addition to removing the remaining portion 203a, the chemical etching has the effect of removing the remaining annular portion 210 by virtue of the mechanical weakening of this annular portion during trimming and especially the creation of cracks into which the etching solution infiltrates.

Once the oxide layer 202 has been removed, a second layer of microcomponents 214 is formed on the exposed surface of the layer 201 (FIG. 3G, step S8). In the example described here, the microcomponents 214 are formed in alignment with the buried microcomponents 204, since a photolithography mask similar to that used to form the microcomponents 204 is used.

A composite structure 500 is then obtained, formed from the second wafer 300 and a transferred layer 215, corresponding to the remaining part of the first wafer 200, comprising the microcomponents 204 and 214.

As a variant, the three-dimensional structure is formed by a multilayer stack, that is to say by bonding one or more additional wafers or substrates onto the layer 201, each additional wafer being in alignment with the directly adjacent layer or layers. A partial trimming, carried out between the two thinning steps in accordance with the invention as described hereinabove, is performed for each wafer so as to form a transferred layer. Furthermore, before each transfer of an additional wafer, it is possible to deposit, on the exposed layer, an oxide layer, for example, a layer of TEOS, so as to make assembly easier and to protect the trimmed regions (in which the material of the underlying wafer is exposed) from subsequent chemical etching.

According to one particular embodiment, one of the layers of microcomponents may especially comprise image sensors.

According to another embodiment, components have been previously formed in the supporting second wafer before its assembly with the first wafer that makes up the transferred layer.

What is claimed is:

1. A method of fabricating a multilayer structure, comprising:
    bonding a first wafer onto a second wafer, at least the first wafer having a chamfered edge; and
    thinning the first wafer to form a transferred layer, thinning the first wafer comprising:
        grinding an exposed side of the first wafer;
        after grinding the exposed side of the first wafer, trimming an edge of the first wafer using a grinding wheel having a working surface comprising grit particles having an average size of greater than or equal to 18 microns, trimming the edge comprising trimming the edge to a defined depth in the first wafer and leaving a portion of the edge of the first wafer having a thickness of less than or equal to 35 µm; and
        chemically etching the first wafer after trimming the edge of the first wafer.

2. The method of claim 1, wherein trimming the edge of the first wafer comprises trimming at least a portion of the first wafer having a width equal to a width over which the chamfered edge extends.

3. The method of claim 2, wherein trimming the at least a portion of the first wafer further comprises trimming at least a portion of the first wafer having a width between 2 mm and 8 mm.

4. The method of claim 1, further comprising selecting the first wafer to comprise at least one of a silicon wafer and an SOI structure.

5. The method of claim 1, further comprising forming an oxide layer on the first wafer prior to bonding the first wafer onto the second wafer.

6. The method of claim 1, wherein trimming the edge of the first wafer further comprises trimming a flank in the first wafer at an angle of about 45° to a plane of the first wafer.

7. The method of claim 1, further comprising selecting the first wafer to comprise a plurality of components.

8. The method of claim 1, further comprising selecting the second wafer to comprise a sapphire wafer.

9. The method of claim 1, further comprising selecting the second wafer to comprise a silicon wafer.

10. The method of claim 9, further comprising forming an oxide layer on the second wafer prior to bonding the first wafer onto the second wafer.

11. The method of claim 1, further comprising forming a first plurality of components on a first side of the first wafer prior to bonding the first wafer onto the second wafer, and wherein bonding the first wafer onto the second wafer comprises bonding the first side of the first wafer to the second wafer.

12. The method of claim 11, further comprising forming additional components on a second side of the first wafer opposite from the first side of the first wafer.

13. The method of claim 11, further comprising selecting the first plurality of components to comprise image sensors.

14. A method of fabricating a multilayer structure, comprising:
    bonding a first wafer onto a second wafer, at least the first wafer having a chamfered edge extending at least partially around a periphery of the first wafer; and
    thinning the first wafer to form a transferred layer, thinning the first wafer comprising:
        removing material from a surface of the first wafer on a side thereof opposite the second wafer;
        grinding the periphery of the first wafer to form a thinner portion of the first wafer proximate the periphery of the first wafer; and
        removing the thinner portion of the first wafer using a chemical etching process.

15. The method of claim 14, wherein bonding the first wafer onto the second wafer comprises directly bonding the first wafer to the second wafer.

16. The method of claim 15, wherein directly bonding the first wafer to the second wafer comprises directly bonding the first wafer to the second wafer at about 450° C. or less.

17. The method of claim 15, wherein directly bonding the first wafer to the second wafer comprises establishing a bond energy between the first wafer and the second wafer of 1 J/m² or less.

18. The method of claim 16, further comprising forming the thinner portion of the first wafer to have a thickness of about 35 microns or less.

19. The method of claim 18, further comprising forming the thinner portion of the first wafer to have a thickness of about 10 microns or more.

20. The method of claim 19, further comprising forming cracks in the thinner portion of the first wafer.

21. The method of claim 20, wherein grinding the periphery of the first wafer to form the thinner portion comprises grinding the periphery of the first wafer with a grinding wheel having a working surface comprising grit particles having an average size of greater than or equal to 18 microns.

22. The method of claim 19, further comprising forming the thinner portion of the first wafer to have a width between about 2 mm and about 10 mm.

* * * * *

UNITED STATES PATENT AND TRADEMARK OFFICE
CERTIFICATE OF CORRECTION

PATENT NO. : 8,298,916 B2  
APPLICATION NO. : 13/043088  
DATED : October 30, 2012  
INVENTOR(S) : Alexandre Vaufredaz et al.

It is certified that error appears in the above-identified patent and that said Letters Patent is hereby corrected as shown below:

In the specification:

| | | |
|---|---|---|
| COLUMN 1, | LINE 36, | change "are" to --are,-- |
| COLUMN 1, | LINE 37, | change "structures" to --structures,-- |
| COLUMN 3, | LINE 46, | change "bonding—provided" to --bonding, provided-- |
| COLUMN 4, | LINE 61, | change "wafer" to --wafer,-- |
| COLUMN 5, | LINE 6, | change "surfaces—that" to --surfaces, that-- |
| COLUMN 5, | LINE 11, | change "initiated—typically" to --initiated, typically-- |
| COLUMN 5, | LINE 41, | change "not" to --may not-- |
| COLUMN 6, | LINE 48, | change "110—the" to --110, the-- |
| COLUMN 7, | LINE 43, | change "203*a*," to --203,-- |
| COLUMN 7, | LINE 48, | change "part" to --portion-- |
| COLUMN 8, | LINE 23, | change "2010" to --210-- |

Signed and Sealed this  
Tenth Day of February, 2015

Michelle K. Lee  
*Deputy Director of the United States Patent and Trademark Office*